(12) United States Patent
Greenberg et al.

(10) Patent No.: US 9,703,625 B1
(45) Date of Patent: Jul. 11, 2017

(54) METHOD AND APPARATUS FOR DETECTING OR CORRECTING MULTI-BIT ERRORS IN COMPUTER MEMORY SYSTEMS

(71) Applicant: Cadence Design Systems, Inc., San Jose, CA (US)

(72) Inventors: Marc Greenberg, Austin, TX (US); Steven Lee Shrader, Meridian, ID (US)

(73) Assignee: Cadence Design Systems, Inc., San Jose, CA (US)

( * ) Notice: Subject to any disclaimer, the term of this patent is extended or adjusted under 35 U.S.C. 154(b) by 17 days.

(21) Appl. No.: 13/830,195

(22) Filed: Mar. 14, 2013

(51) Int. Cl.
G06F 11/10 (2006.01)
H03M 13/19 (2006.01)

(52) U.S. Cl.
CPC .......... *G06F 11/10* (2013.01); *G06F 11/1012* (2013.01); *G06F 11/1048* (2013.01); *H03M 13/19* (2013.01)

(58) Field of Classification Search
CPC ............. G06F 11/1012; G06F 11/1024; G06F 11/1048; G06F 11/10; G06F 11/1004; G06F 11/1008; G06F 11/1028; G06F 11/1068; G06F 11/1076; G06F 11/108; G06F 11/1084; G06F 11/1092; H03M 13/17; H03M 13/19

USPC .............. 714/755, 757, 758, 763, 773, 777; 341/55
See application file for complete search history.

(56) References Cited

U.S. PATENT DOCUMENTS

| | | | |
|---|---|---|---|
| 2008/0163032 A1* | 7/2008 | Lastras-Montano | G06F 11/1044 714/785 |
| 2009/0063759 A1* | 3/2009 | Lastras-Montano | G06F 13/4243 711/104 |
| 2012/0166904 A1* | 6/2012 | Bandholz | 714/746 |
| 2014/0122955 A1* | 5/2014 | Wang et al. | 714/738 |

OTHER PUBLICATIONS

Maurizio Skerlj, Error Protected Data Bus Inversion Using Standard DRAM Components, 2008, IEEE Computer Society, 9th International Symposium on Quality Electronic Design, 35-42.*

* cited by examiner

*Primary Examiner* — Albert Decady
*Assistant Examiner* — Christian Dorman
(74) *Attorney, Agent, or Firm* — Schwegman Lundberg & Woessner, P.A.

(57) ABSTRACT

A method for detecting a data bit inversion (DBI) error in a memory system is disclosed. The method and system comprise calculating an error correcting code (ECC) from each of the 8 beats of a burst of data such that no more than one bit per byte is included in each ECC calculation. The method and system further include determining if there is an inversion of one byte in the burst.

10 Claims, 7 Drawing Sheets

METHOD AND APPARATUS FOR DETECTING OR CORRECTING MULTI-BIT ERRORS IN COMPUTER MEMORY SYSTEMS

FIELD OF THE INVENTION

The present disclosure relates generally to computer memory systems, and more particularly to a method and apparatus for detecting or correcting multi-bit errors in computer memory systems.

BACKGROUND

DDR4 memories have an additional output signal called DBI (Data Bit Inversion or Data Bus Inversion) that is used to invert all the bits in the transmitted data. DBI is used to reduce power and to improve signal integrity on memory transfer. However, the DBI bit itself may experience signal integrity events leading to accidental inversion of the bits in the transmitted data. While the data bits are protected from errors using Single-Error-Correct, Double-Error-Detect (SECDED) Error Correcting Code (ECC) algorithms, the Hamming function with parity presently used for SECDED cannot reliably detect or correct the consecutive 8-bit received data error that would be the result of a signal integrity event error on the DBI signal.

SUMMARY

Systems and methods in accordance with the present disclosure take advantage of DDR3 and DDR4 memories capability to transmit data on 8 consecutive clock edges ("beats" or burst-of-8). In a first embodiment the error correcting code calculation is reordered such that ECC is calculated on bits from all 8 beats of a burst of data such that no more than one bit per byte is included in each ECC calculation. In so doing, multi-bit errors in one byte of a burst of data, including complete inversion of one byte in the burst of data, are now correctable while maintaining the normal corrections using an ECC.

A method for detecting a data bit inversion (DBI) error in a memory system is disclosed. The method and system comprise calculating an error correcting code (ECC) from each of the 8 beats of a burst of data such that no more than one bit per byte is included in each ECC calculation. The method and system further include determining if there is an inversion of one byte in the burst.

DETAILED DESCRIPTION

The present disclosure relates generally to detecting or correcting multi-bit errors, and more particularly to a method and apparatus for detecting or correcting multi-bit errors in computer memory systems. The system and method should be easily implemented, cost effective, reliable, and should be adaptable to existing memory environments. The present disclosure addresses such a need.

The following description is presented to enable one of ordinary skill in the art to make and use the disclosure and is provided in the context of a patent application and its requirements. Various modifications to the embodiments and the generic principles and features described herein will be readily apparent to those skilled in the art. Thus, the present disclosure is not intended to be limited to the embodiments shown, but is to be accorded the widest scope consistent with the principles and features described herein.

Figure 1:
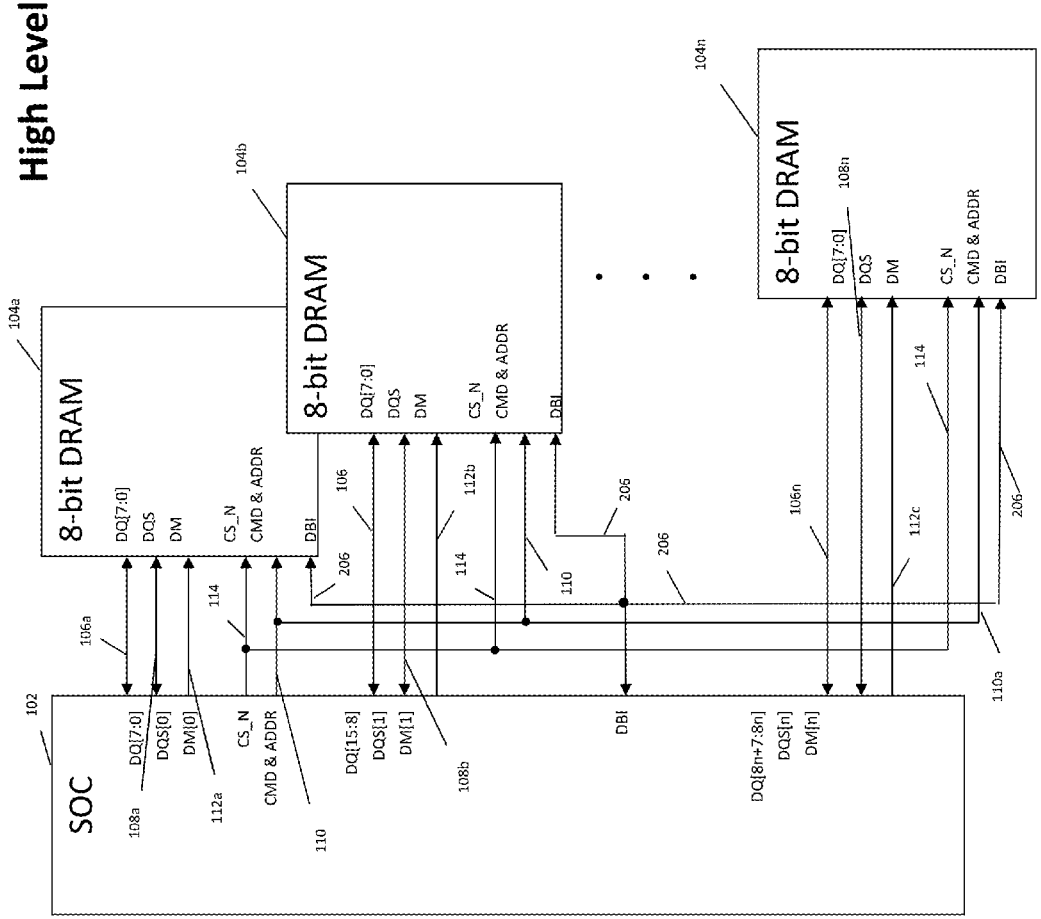
FIG. 1 is a block diagram of a double data rate 4 (DDR4) memory system in accordance with an embodiment.

FIG. 1 is a block diagram of a double data rate 4 (DDR4) memory system 100 in accordance with an embodiment. Although the method and system in accordance with the present disclosure will be discussed on the context of a DDR4 memory system one of ordinary skill in the art will readily recognize that many other types of memory system could be utilized and that use would be within the spirit and scope of the present disclosure. The DDR4 system 100 includes a system-on-a-chip (SoC) 102 which is coupled to a plurality of 8-bit DRAM chips 104a-104n. Although 8-bit DRAM chips 104a-104n are shown, one of ordinary skill in the art recognizes that a system and method in accordance with the present disclosure is not so limited. Accordingly, the DRAM chips 104a-104n can be any size and their use would be within the spirit and scope of the present disclosure. The SoC 102 communicates with the plurality of DRAM chips 104a-104n. The SoC 102 is coupled to each of the DRAM chips 104a-104n via DQ output bus 106a-106n and DQS lines 108a-108n. A command and address (CMD & ADDR) bus 110 from the SoC 102 provides address, bank, bank group, and command signals as defined by the DRAM protocol.

The memory system also utilizes a Data Bit Inversion (DBI) bit 206 between the SOC 102 and the DRAMs 108a-108n. The DBI bit 206 is utilized in DDR memories to reduce power and to improve signal integrity. However, the DBI bit 206 may also have signal integrity issues that may lead to errors in the data. To describe these issues in more detail refer now to the following discussion in conjunction with the accompanying figures.

Figure 2:
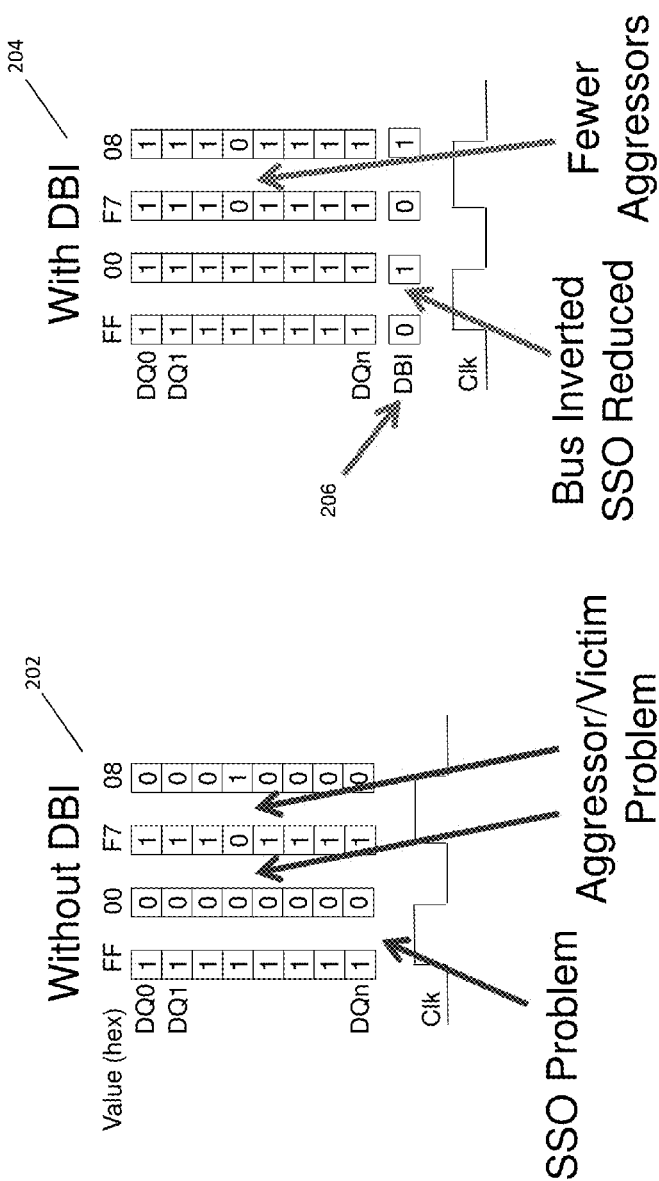
FIG. 2 is a conceptual diagram of memory transfer for both when DBI is not utilized and when DBI is utilized to illustrate the advantages of using DBI.

FIG. 2 is a conceptual diagram of memory transfer of four bytes of data for when DBI is not utilized as shown at 202 and transferring the same four bytes of when DBI is utilized as shown at 204 to illustrate the advantages of using DBI. What is shown in the Figure is that four bytes of data (FF, 00, F7, 08) are being transferred on consecutive clock edges. Without DBI as shown at 202, when switching between FF and 00 all of the bits need to be switched from 0 to 1. This can cause what is known as a simultaneously switching output (SSO) problem because all of the bits must be changed at the same time. SSO is a condition where since all the bits are transitioning the power consumption of the chip is increased and there is a significant chance that all the bits will not transition properly. Similarly when the memory transfer causes the bits to change from 00 to F7 there may also be a SSO problem because all of but one of the bits is switched. In both of these situations the signal may not be clean and accurate because the SSO problem. In addition, when the memory transfer causes the bits to change from 00 to F7 the signal integrity of the one bit that is not switched can be affected by all the bits that are switched. The same thing is true for the F7 to 08 transition. This is referred to as an aggressor/victim problem.

To address both of these issues a sideband signal DBI bit 206 is utilized in conjunction with the data transfer. The DBI bit 206 would typically be a calculated value in the DRAM. The meaning of the DBI bit is that all of the other bits have the opposite sense if the DBI bit is set. Therefore, referring to 204 since the DBI bit is set to 1 during the FF to 00 transition none of the bits need to transition and therefore the SSO problem is minimized. Similarly in the 00 to F7 transition and the F7 to 08 transition the appropriately set DBI bit 206 minimizes the victim aggressor problem.

Although DBI is effective for signal integrity issues and helps to minimize power consumption, if there is signal integrity error in the DBI function itself it is not detectable. To describe this issue in more detail refer to following description in conjunction with the accompanying Figures.

Under current methodologies errors in the memory devices are detected utilizing an error correcting code (ECC), typically a Hamming function. The typical ECC utilized is a SECDED ECC.

Figure 3:
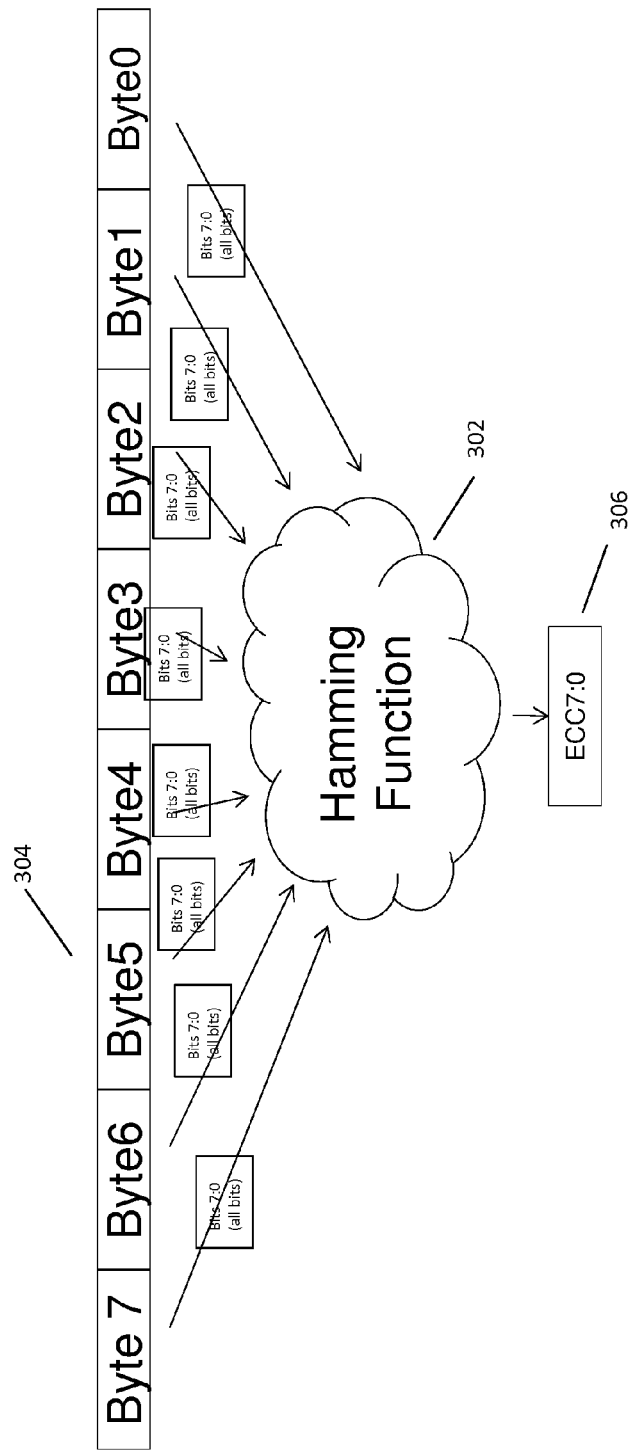
FIG. 3 is a diagram which illustrates the use of a conventional SECDED ECC for detecting errors during data transfers.

FIG. 3 is a diagram which illustrates the use of a conventional SECDED ECC for detecting errors during data transfers. In this embodiment, the ECC or Hamming code 302 is calculated on 8 bytes in the word 304 transmitted on the same beat. However the ECC 302 cannot detect a DBI error changing the value of an entire byte. The SECDED ECC 7:0 306 can either correct one bit or detect two bit errors in Byte7:Byte0. However, the SECDED ECC 306 cannot correct an 8-bit error caused by a DBI being the wrong polarity.

A Systems and methods in accordance with the present disclosure take advantage of DDR3 and DDR4 memories capability to transmit data on 8 consecutive clock edges hereinafter referred to as a burst of data or as a burst-of-8 (each burst of data or burst-of-8 includes 8 "beats"). In a first embodiment, the error correcting code calculation is reordered such that ECC is calculated on bits from a burst of data such that no more than one bit per byte is included in each ECC calculation. In so doing, multi-bit errors in one byte of a burst of data, including complete inversion of one byte in the burst of data, are now correctable while maintaining the normal corrections using an ECC.

Systems and methods in accordance with the present disclosure provides for the detection and the correction of signal integrity errors caused by an error in the DBI bit. The system and methods have low latency and have the ability to correct 1 bit errors in 64 bits and detect 2 bit errors in 64 bits while also being able to correct for the DBI errors. To describe the features of these embodiments in more detail refer now to following description in conjunction with the accompanying Figures.

Methods and systems for detecting and correcting multi-bit errors of data in a memory system are disclosed. Embodiments described herein can take the form of an entirely hardware implementation, an entirely software implementation, or an implementation containing both hardware and software elements. Embodiments may be implemented in software, which includes, but is not limited to, application software, firmware, resident software, microcode, etc.

The steps described herein may be implemented using any suitable controller or processor, and software application, which may be stored on any suitable storage location or computer-readable medium. The software application provides instructions that enable the processor to cause the receiver to perform the functions described herein.

Furthermore, embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-RAN). To describe the features of the present disclosure in more detail refer now to the following description in conjunction with the accompanying Figures.

Figure 4A:
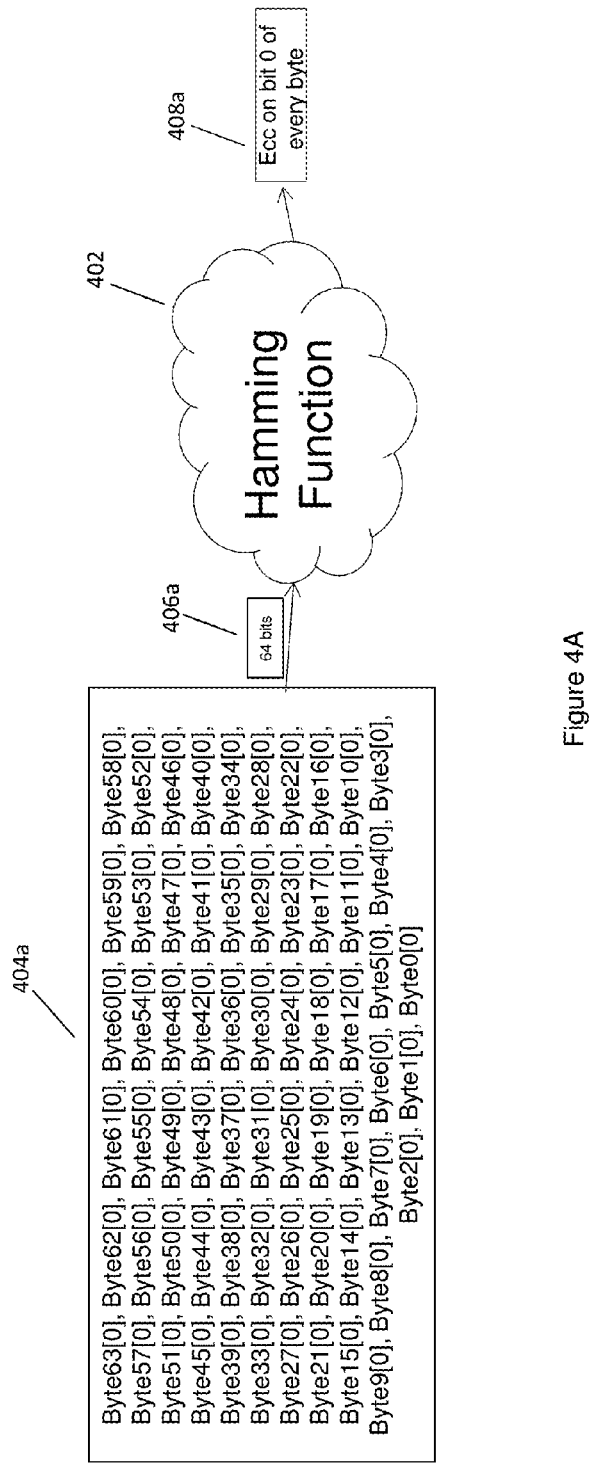
FIGS. 4A-4C are diagrams which illustrate a first embodiment of detecting and correcting DBI errors during data transfers.
Figure 4B:
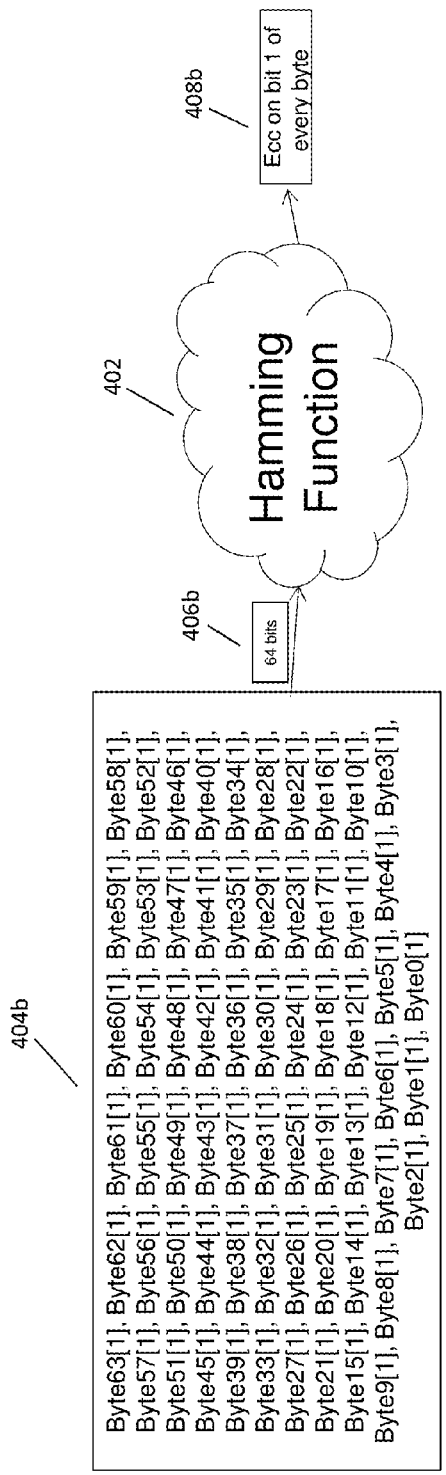
Figure 4C:
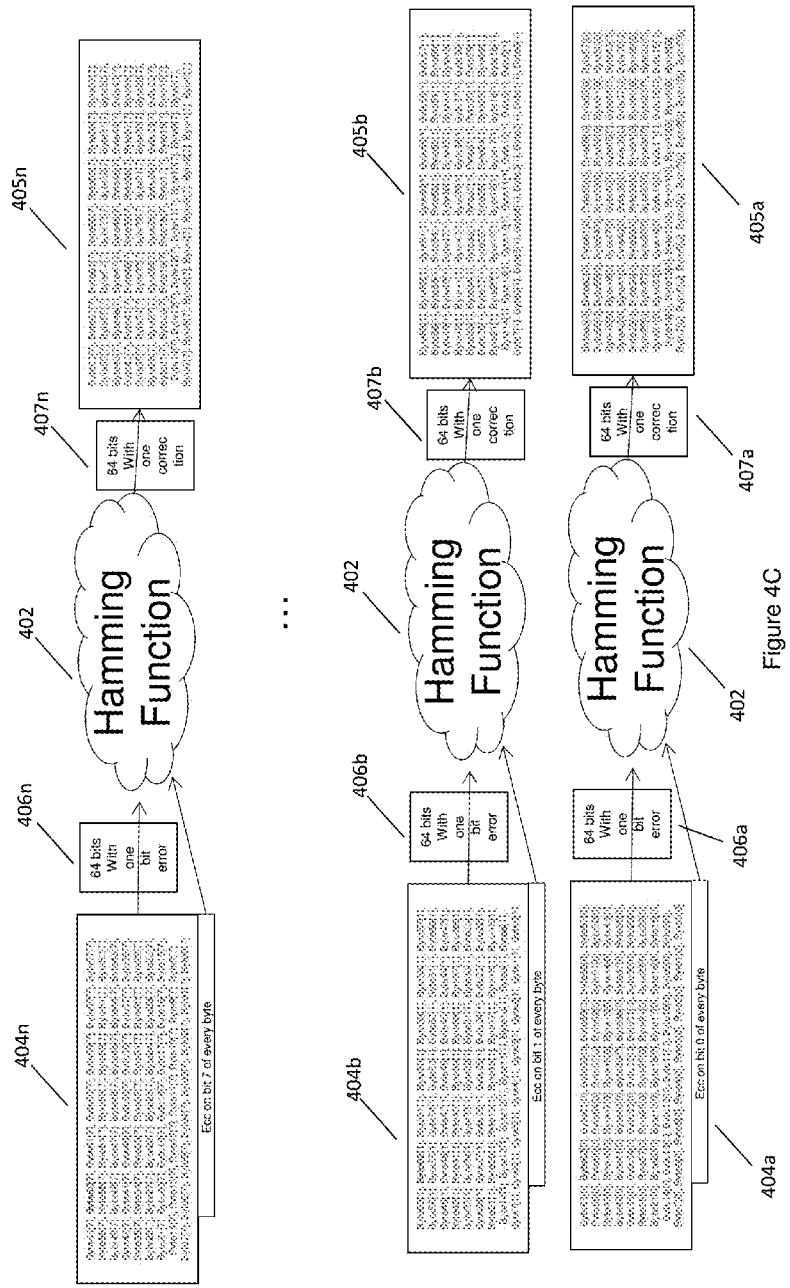

FIGS. 4A-4C are diagrams which illustrate a first embodiment of detecting and correcting DBI errors during data transfers. FIG. 4A illustrates as an example a Hamming function 402 operating on bit 0 of every byte in the 64 byte in a 64 byte beat 404a of a burst of data to execute an ECC 408a on bit 0 of every byte. FIG. 4B illustrates as an example the Hamming function 402 operating on bit 1 of every byte in a 64 byte beat 404b of the burst of data to execute an ECC 408b on bit 1 of every byte. In an embodiment, this process will be executed on the same bit location for each 64 byte beat of the burst of data (as aforementioned, there are 8 total beats in each burst of data or burst-of-8). Hence, for a first beat 404a the Hamming function 402 all of the bit 0 locations will be calculated, for a second beat 404b the ECC 402b of all of the bit 1 locations will be calculated. This process will repeat for the remaining bit locations (2-7) to determine if there is a DBI error.

To illustrate the DBI correction process in more detail, FIG. 4C illustrates an example of how the first embodiment corrects a DBI error. In this example because of the DBI inversion, every beat 404a-404n has a one bit error 406a-406n related to byte 62 of the beat 404a-404n. The Hamming function 402 acts on each beat 404a-404n to provide the corrected beat 405a-505n via the one bit correction 407a-407n. Hence as is seen, in this embodiment single-bit errors per 64 bytes are correctable and two bit per 64 byte errors is detectable which is part of the normal ECC functionality.

In addition one complete byte inversion because of a DBI error also is correctable because an ECC is performed on the same bit number within each of the 8 total beats in a complete burst of data. One of ordinary skill in the art recognizes this could be implemented by calculating the ECC on bits within each beat of a burst of data that are indexed or otherwise configured to allow for the detection of a complete byte inversion.

Figure 5:
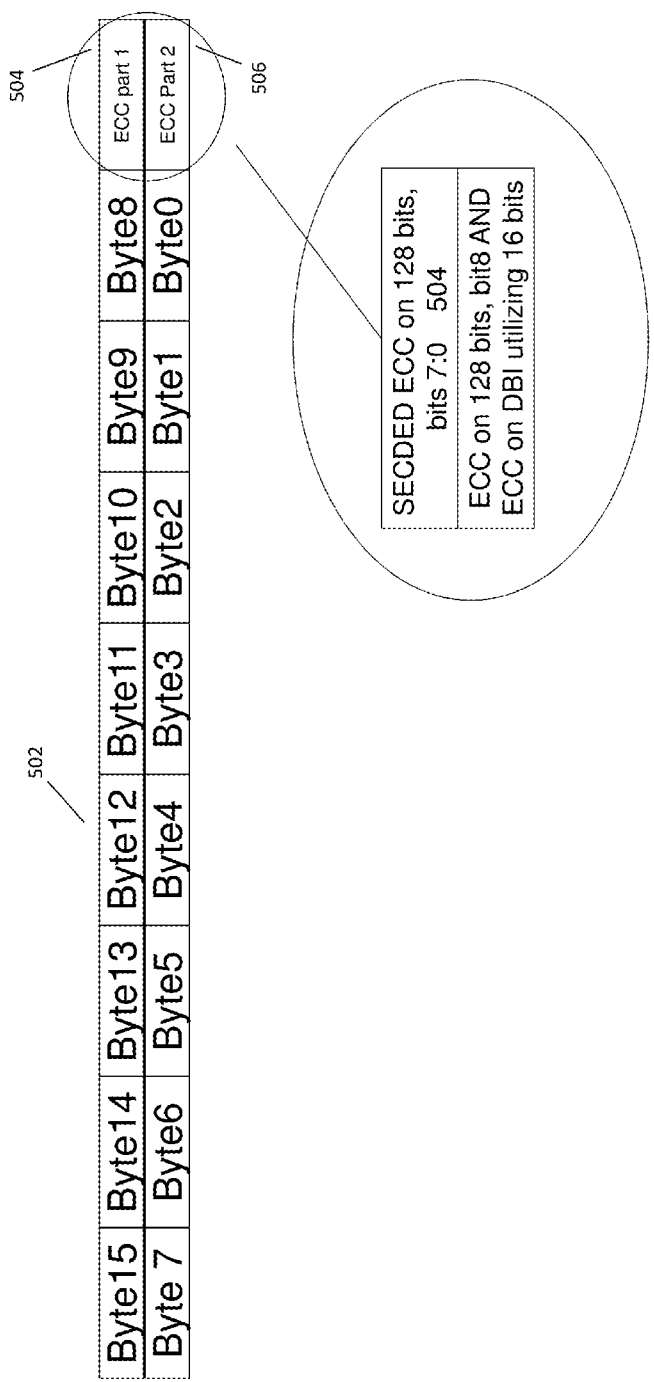
FIG. 5 is a diagram which illustrates a first embodiment of detecting and correcting DBI errors during data transfers.

FIG. 5 is a diagram which illustrates the operation of a second embodiment of the use of an ECC for detecting errors during data transfers. In this embodiment a two stage SECDED ECC or Hamming code is provided on a 16 byte burst of data 502 wherein the errors would be corrected on the data in the first stage 504 and then ECC would be calculated on the DBI in the second stage 506. In this embodiment the first stage ECC on 128 bits of data would require 9 bits (bit 0 to bit 8). The ECC for detecting a DBI error would require 16 bits, that is one bit per byte (16 bytes totals 128 bits as 1 byte=8 bits). Hence as is seen, in this embodiment single-bit errors per 128 bytes are correctable and two bit per 128 byte errors is detectable. In addition, one complete byte inversion because of a DBI error also is correctable because an ECC is performed on the same bit number within the 128 bits of data.

Although the present disclosure has been described in accordance with the embodiments shown, one of ordinary skill in the art will readily recognize that there could be variations to the embodiments, and those variations would be within the spirit and scope of the present disclosure. Accordingly, many modifications may be made by one of ordinary skill in the art without departing from the spirit and scope of the appended claims.

What is claimed is:

1. A method for correcting a data bit inversion (DBI) error in a memory system, the method comprising:
    detecting the DBI error in the memory system, the DBI error including a multi-bit error in at least one byte of a burst of data, the detecting of the DBI error including calculating an error correcting code (ECC) across 8 beats of the burst of data, the 8 beats comprising 64 bytes, each of the 64 bytes having 8 bit positions, the calculating of the ECC across the 8 beats of the burst of data comprising performing an ECC calculation for each bit position of the 8 bit positions such that each ECC calculation is calculated on a same bit position of the 8 bit positions for each of the 64 bytes and no more than one bit from each byte is included in each ECC calculation; and
    correcting the DBI error by using a hamming function on each beat of the burst of data at a time via a one bit correction until the hamming function is performed on every beat of the burst of data.

2. The method of claim 1, wherein the memory system includes at least one DRAM memory.

3. The method of claim 2, wherein the at least one DRAM memory comprises a double data rate (DDR) memory.

4. The method of claim 3, wherein the DDR memory is one of a DDR4 or DDR5 memory.

5. The method of claim 1, wherein the ECC comprises a SECDED ECC.

6. A computer program product having a non-transitory computer readable medium containing program instructions to perform operations for correcting a data bit inversion (DBI) error in a memory system, the method comprising:
    detecting the DBI error in the memory system, the DBI error including a multi-bit error in at least one byte of a burst of data, the detecting of the DBI error including calculating an error correcting code (ECC) across 8 beats of the burst of data, the 8 beats comprising 64 bytes, each of the 64 bytes having 8 bit positions, the calculating of the ECC across the 8 beats of the burst of data comprising performing an ECC calculation for each bit position of the 8 bit positions such that each ECC calculation is calculated on a same bit position of the 8 bit positions for each of the 64 bytes and no more than one bit from each byte is included in each ECC calculation; and
    correcting the DBI error by using a hamming function on each beat of the burst of data at a time via a one bit correction until the hamming function is performed on every beat of the burst of data.

7. The computer program product of claim 6, wherein the memory system includes at least one DRAM memory.

8. The computer program product of claim 7, wherein the at least one DRAM memory comprises a double data rate (DDR) memory.

9. The computer program product of claim 8, wherein the DDR memory is one of a DDR4 or DDR5 memory.

10. The computer program product of claim 6, wherein the ECC comprises a SECDED ECC.

* * * * *